United States Patent
Usami et al.

(12) 
(10) Patent No.: US 6,187,662 B1
(45) Date of Patent: Feb. 13, 2001

(54) SEMICONDUCTOR DEVICE WITH LOW PERMITTIVITY INTERLAYER INSULATING FILM AND METHOD OF MANUFACTURING THE SAME

(75) Inventors: Tatsuya Usami; Noriaki Oda, both of Tokyo (JP)

(73) Assignee: NEC Corporation (JP)

(*) Notice: Under 35 U.S.C. 154(b), the term of this patent shall be extended for 0 days.

(21) Appl. No.: 09/229,213

(22) Filed: Jan. 13, 1999

(30) Foreign Application Priority Data

Jan. 19, 1998 (JP) ................................... 10-007147

(51) Int. Cl.[7] ................................................. H01L 21/316
(52) U.S. Cl. ........................ 438/624; 438/781; 438/782; 257/758; 257/760
(58) Field of Search ..................... 257/758, 760; 468/624; 438/624, 781, 782, 787

(56) References Cited

U.S. PATENT DOCUMENTS

| | | | | |
|---|---|---|---|---|
| 5,604,380 | * | 2/1997 | Nishimura et al. | 257/758 |
| 5,679,980 | * | 10/1997 | Summerfelt | 257/758 |
| 5,792,702 | * | 8/1998 | Liang | 438/624 |

FOREIGN PATENT DOCUMENTS

| | | | |
|---|---|---|---|
| 6-216118 | 8/1994 | (JP) | H01L/21/316 |
| 7-235535 | 9/1995 | (JP) | H01L/21/318 |
| 7240460 | 9/1995 | (JP) | H01L/21/768 |
| 7-263547 | 10/1995 | (JP) | H01L/21/768 |
| 8111458 | 4/1996 | (JP) | H01L/21/768 |
| 8-213461 | 8/1996 | (JP) | H01L/21/768 |
| 8-255791 | 10/1996 | (JP) | H01L/21/316 |
| 9-232308 | 9/1997 | (JP) | H01L/21/316 |
| 9-28315 | 10/1997 | (JP) | H01L/21/316 |
| 10-247686 | 9/1998 | (JP) | H01L/21/768 |
| 11-102964 | 4/1999 | (JP) | H01L/21/768 |

OTHER PUBLICATIONS

"Planarization performance of Flowable Oxide in the Sub–0.5um Regime" Zoes et al.
Conference Proceedings ULSI ZI 1996 Materials Research Society; pp. 121–125.

* cited by examiner

Primary Examiner—Matthew Smith
Assistant Examiner—Victor Yevsikov
(74) Attorney, Agent, or Firm—Hayes, Soloway, Hennessey, Grossman & Hage, P.C.

(57) ABSTRACT

A semiconductor device includes a first insulating film formed on a semiconductor substrate. Wiring patterns are partially formed on the first interlayer insulating film. A second insulating film is formed to cover the first insulating film and the wiring patterns. A third insulating film is formed on the second insulating film. In this case, at least an upper surface portion of the first insulating film has a moisture containing percentage lower than that of the second insulating film.

18 Claims, 5 Drawing Sheets

SEMICONDUCTOR DEVICE WITH LOW PERMITTIVITY INTERLAYER INSULATING FILM AND METHOD OF MANUFACTURING THE SAME

BACKGROUND OF THE INVENTION

1. Field of the Invention

The present invention relates to a semiconductor device and a method of manufacturing of the same. More particularly, the present invention relates to a semiconductor device and a method of manufacturing the same, in which an SOG (spin on glass) film using a low dielectric constant material is formed as a part of an interlayer insulating film.

2. Description of the Related Art

Conventionally, an SOG (spin on glass) insulating film is formed by a spin coating method. The technique using such an SOG film as a part of an interlayer insulating film is frequently used to remove unevenness of the surface of a substrate to be formed due to wiring patterns.

However, in the conventional SOG film using silicate material, there are the following problems. That is, first, ① a crack is easily generated because of large volume shrinkage at the time of a baking process. Second, ② the spin coating method needs to be performed plural times to form a thick SOG film, because the film thickness of the SOG film is at most 200 nm when the spin coating method is performed once. And, third, ③ another material having lower dielectric constant is needed to decrease capacitance between wiring patterns, because the dielectric constant of the SOG film is approximately the same as that of a $SiO_2$ which is formed by a CVD method. For these reasons, a SOG film using HSQ (Hydrogen Silsesquoxane: $(HSiO_{3/2})_n$) is proposed to solve the above problems.

FIGS. 1A to 1D are cross sectional views of a semiconductor device using an SOG film as a part of an interlayer insulating film in a manufacturing method. This method is proposed in "PLANARIZATION PERFORMANCE OF FLOWABLE OXIDE™ IN THE SUB-0.5 μm REGIME" (Advanced Metallization and Interconnect Systems for ULSI Applications, 1995, pp. 121–125).

Figure 1A:
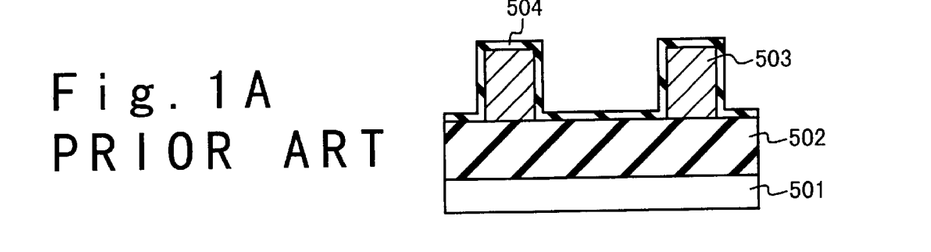
FIGS. 1A to 1D are cross sectional views of a semiconductor device in a conventional manufacturing method.

As shown in FIG. 1A, a silicon oxide film 502 is formed on a silicon substrate 501 as a lower interlayer insulating film by a plasma CVD method using TEOS (Tetraethoxysilane) as a material source. After metal wiring patterns 503 are formed on the interlayer insulating film 502, a liner oxide film 504 is formed by a plasma CVD method using TEOS as a material source to cover the metal wiring patterns 503.

Figure 1B:
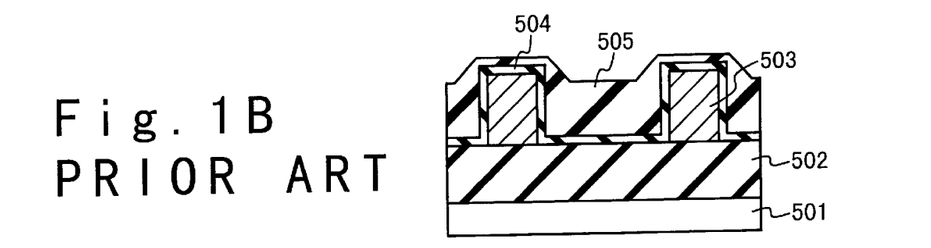

Subsequently, as shown in FIG. 1B, HSQ is spin-coated to form an HSG-SOG film 505. Then, the HSG-SOG film 505 is baked.

Figure 1C:
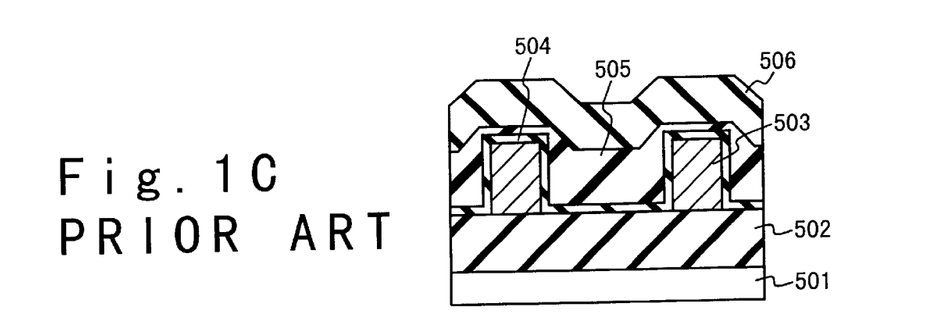

Next, as shown in FIG. 1C, a silicon oxide film 506 is formed on the HSG-SOG film 505 by a plasma CVD method using TEOS as a material source.

Figure 1D:
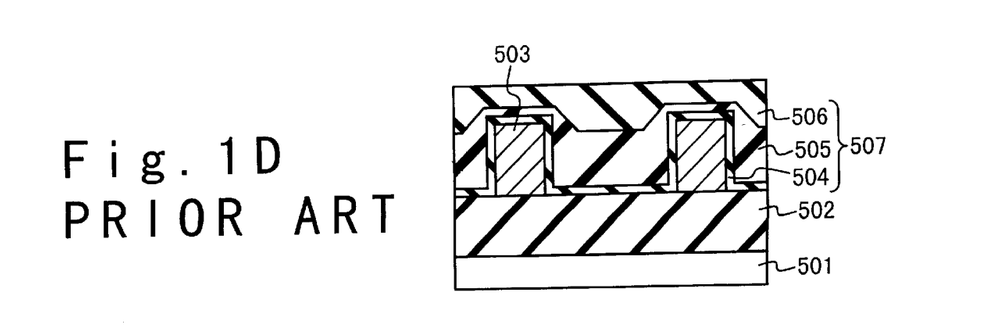

Subsequently, as shown in FIG. 1D, the silicon oxide film 506 is flattened by a CMP (chemical mechanical polishing) method to form an upper interlayer insulating film 507.

It should be noted that similar manufacturing methods are described in Japanese Laid Open Patent Applications (JP-A-Heisei 7-240460 and JP-A-Heisei 8-111458).

However, in the above-mentioned structure of the interlayer insulating films, there is a problem. That is, the dielectric constant of the HSQ film increases because of the escape of moisture from the lower silicon oxide film using the TEOS system material gas at the time of baking of the HSQ film. For a comparison experiment, a comparison sample is formed in which the whole interlayer insulating film is formed of a silicon oxide film by a CVD method using a high density plasma. In both of the conventional sample shown in FIGS. 1A to 1D and the comparison sample, metal wiring patterns are formed to have a space of 0.3 μm. When the capacitance of the both samples between the metal wiring patterns are measured, the conventional sample has a capacitance between the metal wiring patterns of 110% of that of the capacitance of the comparison sample between the metal wiring patterns. That is, the HSQ film, which should have a low dielectric constant film, has a dielectric constant higher than that of the silicon oxide film. This is because moisture generated from the lower film in case of baking of the HSQ film invades the HSQ film, so that Si—H couplings decrease and Si—OH couplings increase. The dielectric constant of the HSQ film increases as the Si—H couplings decrease and the Si—OH couplings increase. It is known that the dielectric constant of the HSQ film becomes high when the HSQ film is baked in an atmosphere containing oxygen. Therefore, it could be considered that the same phenomenon occurs.

When the HSQ film is covered by an upper insulating film, the HSQ film is not influenced so much by the upper insulating film, compared with the lower insulating film. However, in a portion of the HSQ film contacting the upper insulating film, the Si—OH couplings increase and the Si—H couplings decrease.

SUMMARY OF THE INVENTION

The present invention is accomplished to solve the above mentioned problems. Therefore, an object of the present invention is to provide a semiconductor device in which it can be prevented that Si—H couplings in a low dielectric constant film such as a HSQ film decrease due to moisture supplied from another insulating film contacting the low dielectric constant film in a baking process.

Another object of the present invention is to provide a semiconductor device in which the increase of a dielectric constant of a low dielectric constant film such as a HSQ film can be prevented.

Still another object of the present invention is to provide a method of manufacturing the above semiconductor devices.

In order to achieve an aspect of the present invention, a semiconductor device includes a first insulating film formed on a semiconductor substrate. Wiring patterns are partially formed on the first interlayer insulating film. A second insulating film is formed to cover the first insulating film and the wiring patterns. A third insulating film is formed on the second insulating film. In this case, at least an upper surface portion of the first insulating film has a moisture containing percentage lower than that of the second insulating film.

The semiconductor device may further include a liner insulating film formed to cover the first insulating film and the wiring patterns. In this case, the second insulating film is formed on the liner insulating film.

The second insulating film has a relative dielectric constant smaller than 3.5, and the second insulating film includes Si—H couplings.

The upper surface portion of the first insulating film has a moisture containing percentage lower than 0.02 wt %. In this case, the second insulating film is formed of one of a silicon oxide film containing a PSG film and a BPSG film, a silicon oxide nitride (SiON) film, a silicon nitride film, and a fluorine containing silicon oxide film.

Also, it is desirable that at least a lower surface portion of the third insulating film has a moisture containing percentage lower than 0.02 wt %. The third insulating film is formed of one of a silicon oxide film containing a PSG film and a BPSG film, a silicon oxide nitride (SiON) film, a silicon nitride film, and a fluorine containing silicon oxide film.

In order to achieve another aspect of the present invention, a method of manufacturing a semiconductor device, includes the steps of:

forming a first insulating film on a semiconductor substrate such that at least an upper surface portion of the first insulating film has a first moisture containing percentage;

forming wiring patterns on the first insulating film;

forming a second insulating film to cover the first insulating film and the wiring patterns, the second insulating film having a second moisture containing percentage lower than the first moisture containing percentage; and forming a third insulating film formed on the second insulating film.

In this case, the second insulating film is formed by a spin-coating method using HSQ (hydrogen silisesquoxane: $(HSiO_{3/2})_n$) or polysilazane. In order to form the second insulating film, a first heat treatment is performed to the second insulating film formed by the spin-coating method at a predetermined temperature for a predetermined time. Thus, the second moisture containing percentage is a moisture containing percentage after the first heat treatment.

Also, the first insulating film may be formed by a CVD method using a $SiH_4$ gas or an organic silane source with Si—H couplings as a reacting gas. The first insulating film is formed of one of $SiO_2$, $SiO_2$ including P or B, $Si_3N_4$, SiON, and SiOF. The method desirably includes the step of performing a second heat treatment to the first insulating film before the step of forming the second insulating film. Thus, the first moisture containing percentage is a moisture containing percentage after the second heat treatment.

In order to achieve still another aspect of the present invention, a method of manufacturing a semiconductor device, includes the steps of:

forming a first insulating film on a semiconductor substrate;

forming wiring patterns on the first insulating film;

forming a liner insulating film to cover the first insulating film and the wiring patterns such that at least an upper surface portion of the liner insulating film has a first moisture containing percentage;

forming a second insulating film on the liner insulating film, the second insulating film having a second moisture containing percentage lower than the first moisture containing percentage; and forming a third insulating film formed on the second insulating film.

It is desirable that the liner insulating film is formed by a CVD method using $SiH_4$ gas or an organic silane source with Si—H couplings as a reacting gas. Also, the liner insulating film is formed of one of $SiO_2$, $SiO_2$ including P or B, $Si_3N_4$, SiON, and SiOF.

The method may further include the step of performing a third heat treatment to the liner insulating film before the step of forming the second insulating film. Thus, the first moisture containing percentage is a moisture containing percentage after the third heat treatment.

DESCRIPTION OF THE PREFERRED EMBODIMENTS

Next, a semiconductor device of the present invention will be described below in detail with reference to the attached drawings.

Figure 2:
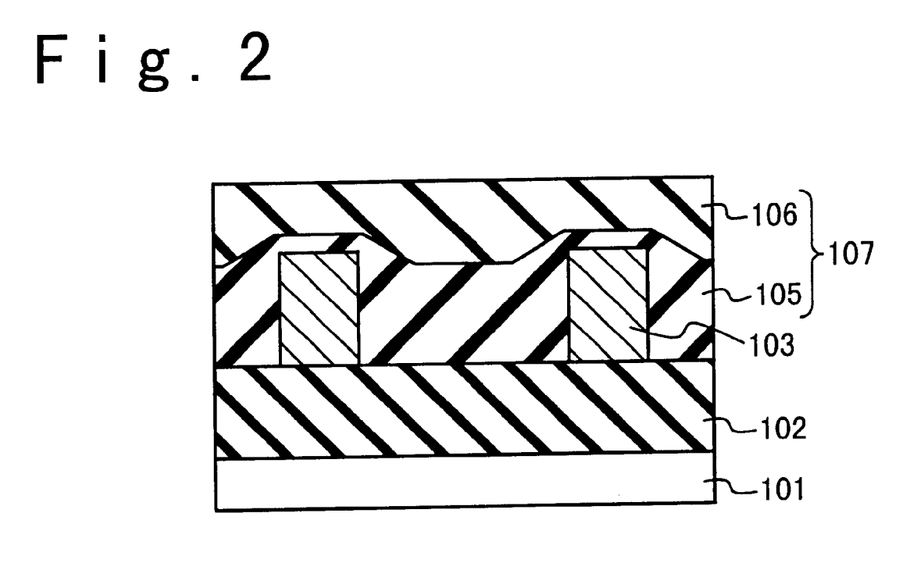
FIG. 2 is a cross sectional view illustrating the structure of a semiconductor device according to a first embodiment of the present invention.

FIG. 2 is a cross sectional view illustrating the structure of the semiconductor device according to the first embodiment of the present invention. A first interlayer insulating film 102 is formed on a silicon substrate 101 on which elements such as a transistor is formed. Metal wiring patterns 103 are formed on the first interlayer insulating film 102. An SOG film 105 with a low dielectric constant is formed on the first interlayer insulating film 102 by spin coating of HSQ to cover the first interlayer insulating film 102 and the metal wiring patterns 103. An interlayer insulating film 106 is formed by a CVD method to cover the SOG film 105. The CVD insulating film 106 is subjected to a chemical mechanical polishing (CMP) method to have a flat surface. A second interlayer insulating film 107 is composed of the low dielectric constant SOG film 105 and the CVD insulating layer 106 which has been formed on the SOG film 105.

In this case, the moisture containing percentage of the first interlayer insulating film 102, especially, an upper layer portion of the first interlayer insulating film 102 is suppressed lower than that of the low dielectric constant SOG film 105 in the present invention. Also, the moisture containing percentage of the CVD insulating layer 106 is suppressed lower than that of the low dielectric constant SOG film 105, according to necessity.

Second metal wiring patterns (not shown) may be formed on the second interlayer insulating film 107. Similarly, one or more sets of an interlayer insulating film and metal wiring patterns may be formed.

The upper portion of the first interlayer insulating film contacting the low dielectric constant SOG film 105 and the CVD insulating layer 106 may be the following film which is formed by a plasma CVD method using $SiH_4$ gas as a material gas. That is, the film may be a silicon oxide ($SiO_2$) film containing PSG and BPSG, a silicon oxide nitride (SiON) film, a silicon nitride ($Si_3N_4$) film, or a fluorine containing silicon oxide (SiOF) film.

Also, the film may be formed by a plasma CVD method using a $N_2O$ gas and an organic silane source containing a Si—H coupling such as TMS (Trimethoxysilane) and TES (Triethoxysilane). In this case, the film may be a silicon oxide film containing PSG and BPSG. In case of the $SiH_4$ gas, it is desirable to use a high density plasma CVD method using an ICP (inductive coupled plasma) system. However, in case of the organic silane material source, it is desirable to use a dual frequency parallel plate type plasma CVD system.

After the low dielectric constant SOG film 105 such as the HSQ film is baked, the moisture containing percentage of the low dielectric constant SOG film 105 is decreased to about 0.02 wt %. Therefore, it is desirable that the moisture containing percentages of the first interlayer insulating film 102 and CVD insulating film 106 which contact the SOG film are equal to or less than 0.02 wt %. The CVD insulating film meets this condition.

Heat treatment is performed before the low dielectric constant film SOG film 105 is formed, after the first interlayer insulating film 102 is formed or after the metal wiring patterns 103 are formed. The heat treatment is performed at a temperature equal to or higher than 400° C. which is a baking temperature of the low dielectric constant SOG film. Thus, the moisture containing percentage of the first interlayer insulating film 102 is previously decreased. As a result, the good result can be obtained.

The low dielectric constant SOG film 105 can be formed by spin coating HSQ. However, instead, the HSQ-SOG film 105 may be formed by using another material. In this case, the SOG film 105 needs to contain any Si—H couplings and to have the relative dielectric constant equal to or less than 3.5. For example, the SOG film may be formed using polysilazane to have a Si—H coupling left.

Next, a method of manufacturing the semiconductor device according to the first embodiment of the present invention will be described below in detail. FIGS. 3A to 3D are cross sectional vies of the semiconductor device according to the first embodiment of the present invention in a process order.

Figure 3A:
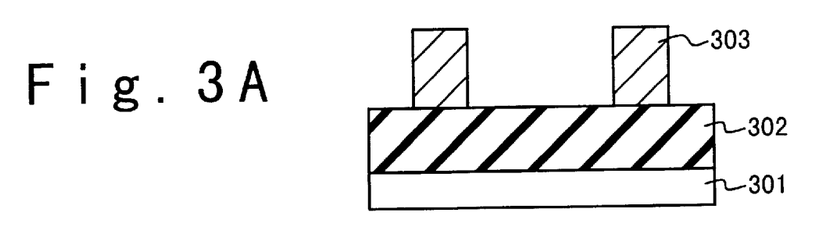
FIGS. 3A to 3D are cross sectional views of the semiconductor device according to the first embodiment of the present invention in a manufacturing method.

Referring to FIG. 3A, a silicon oxide film 302 as a first interlayer insulating film is formed on a silicon substrate 301 on which elements such as a transistor are formed, to have the film thickness of about 7000 Å. In this case, the silicon oxide film is formed by a parallel plate type plasma CVD apparatus using gases of SiH4, O2, and Ar. Subsequently, a laminate conductive film of TiN/Al—Cu/TiN/Ti is deposited and patterned to form metal wiring patterns 303.

Figure 3B:
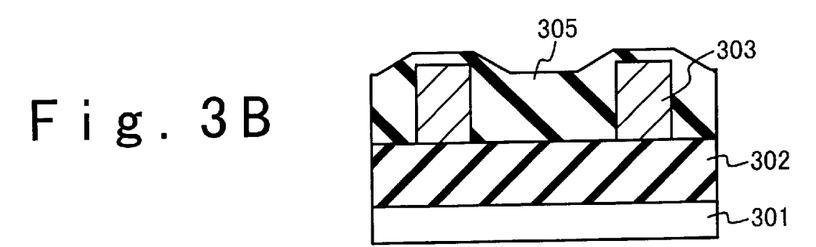

Next, as shown in FIG. 3B, HSQ is dissolved by the solvent MIBK (methyl isobutyl ketone) and the solution is spin coated on the first interlayer insulating film 302 and the metal wiring patterns 303. Then, the substrates formed thus are baked at the temperatures of about 150, 200 and 350° C. for one minute by a hot plate, respectively. Subsequently, the substrates are carried into a vertical diffusion furnace and are baked at a temperature of 400° C. for one hour in a nitrogen atmosphere. Thus, a HSQ-SOG film 305 is formed to have a film thickness of about 4000 Å. In this case, the lower silicon oxide film 302 is formed under a film forming condition, e.g., by a plasma CVD method by a parallel plate type apparatus using a $SiH_4$ gas, to have a moisture containing percentage lower than that of the HSQ film 305. The moisture containing percentage of the silicon oxide film 302 is measured by a TDS (thermal desorption spectrometer) and compared with the moisture containing percentage of the HSQ film 305 after the baking process. As a result, it was found that the moisture containing percentage of the silicon oxide film 302 is about 85% of the moisture containing percentage of the HSQ film 305 after the baking process. Therefore, the moisture never invades the HSQ film 305 from the lower silicon oxide film 302 in case of the baking process of the HSQ film. Thus, the baking process can be performed in a dry atmosphere. Therefore, the HSQ-SOG film 305 can be formed without increase of the dielectric constant.

Figure 3C:
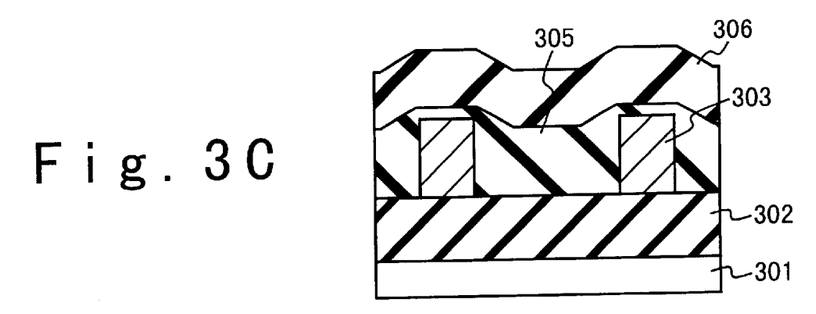

Next, as shown in FIG. 3C, a silicon oxide film 306 with a low moisture containing percentage is formed on the HSQ-SOG film 306 by the parallel plate type plasma CVD apparatus using a $SiH_4$ gas. At this time, the silicon oxide film 306 has a film thickness of about 14000 Å, like the case of the silicon oxide film 302.

Figure 3D:
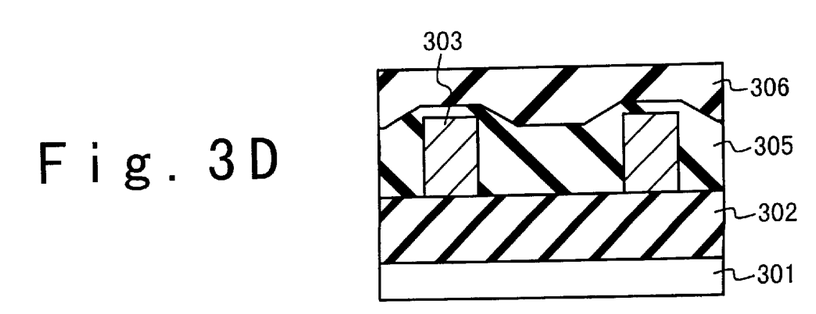

Next, as shown in FIG. 3D, a CMP method is performed on the silicon oxide film 306 such that the silicon oxide film 306 is reduced on the metal wiring patterns 303 by about 7000 Å. Thus, a second interlayer insulating film (305, 306) is formed.

As mentioned above, the interlayer insulating films and the metal wiring patterns are formed, and the capacitance between the wiring patterns is measured. In this case, the space between the wiring patterns is 0.3 µm. For the comparison, a comparison sample is formed such that the whole of second interlayer insulating film is formed of a silicon oxide film by a high density plasma CVD method. The comparison result indicates that the semiconductor device of the present invention has a capacitance between the wiring patterns less by 25% than that of the comparison sample.

Figure 4:
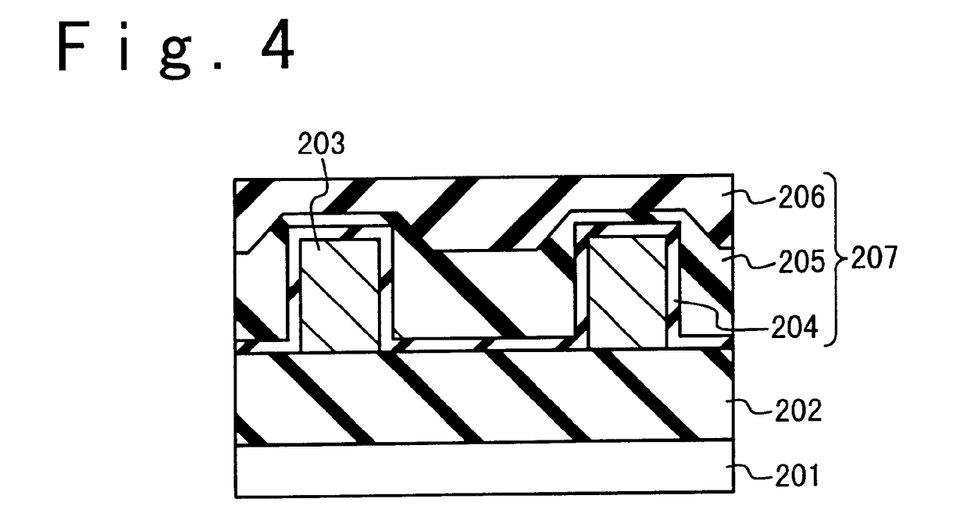
FIG. 4 is a cross sectional view of the semiconductor device according to a second embodiment of the present invention.

FIG. 4 is a cross sectional view illustrating the structure of the semiconductor device according to the second embodiment of the present invention. Referring to FIG. 4, the reference numerals having the same lower 2 digits are allocated to the same components as those in FIG. 2.

The different point between the first embodiment and the second embodiment is in that a thin liner insulating layer 204 is formed to cover the surfaces of the first interlayer insulating film 202 and metal wiring patterns 203. The moisture containing percentage of this liner insulating layer 204 is suppressed lower than that of the low dielectric constant SOG film 205. The liner insulating layer 204 may be formed using the same method as the above-mentioned method of forming the CVD insulating layer 106. The better result can be obtained when heat treatment is performed on the liner insulating layer at the temperature equal to or higher than the baking temperature (about 400° C.) of the low dielectric constant SOG film 205, so that the moisture containing percentage of the liner insulating layer is previously decreased, after the liner insulating layer 204 is formed, before the low dielectric constant film SOG film 205 is formed.

The liner insulating layer 204 is formed as the lower film of the low dielectric constant SOG film 205 to have a low moisture containing percentage. Therefore, in the second embodiment, the first interlayer insulating film 202 needs not to be always a film with a low moisture containing percentage. However, the liner insulating layer 204 is formed as a thin film. Therefore, in order to suppress the dielectric constant of the low dielectric constant SOG film 205, it is desirable that at least an upper portion of the first interlayer insulating film 202 is a film with a low moisture containing percentage. The capacitance between the wiring patterns increases by inserting the liner insulating layer 204. However, leak current between the wiring pattern decreases. Also, the lack of the fitness of the low dielectric constant SOG film to the metal wiring patterns can be improved.

FIGS. 5A to 5D are cross sectional vies of the semiconductor device according to the second embodiment of the present invention in a process order.

Figure 5A:
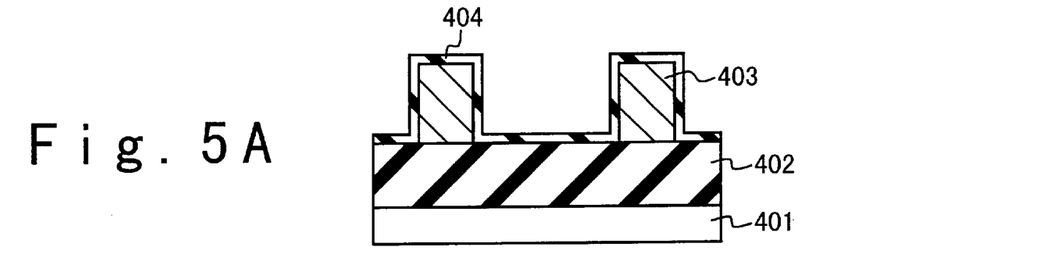
FIGS. 5A to 5D are cross sectional views of the semiconductor device according to the second embodiment of the present invention in a manufacturing method.

Referring to FIG. 5A, like the first embodiment, a silicon oxide film 402 as a first interlayer insulating film is formed on a silicon substrate 401 on which elements such as a transistor are formed, to have the film thickness of about 7000 Å. In this case, the silicon oxide film is formed by an ICP type high density plasma CVD apparatus, using $SiH_4$ gas. Subsequently, a laminate conductive film of TiN/Al—Cu/TiN/Ti is deposited and patterned to form metal wiring patterns 403. Then, a SiON film 404 is formed on the first interlayer insulating film 402 and the metal wiring patterns 403 by a parallel plate type plasma CVD apparatus using gases of $SiH_4$, $NH_3$, $N_2O$, to have the film thickness of about 1000 Å.

Figure 5B:
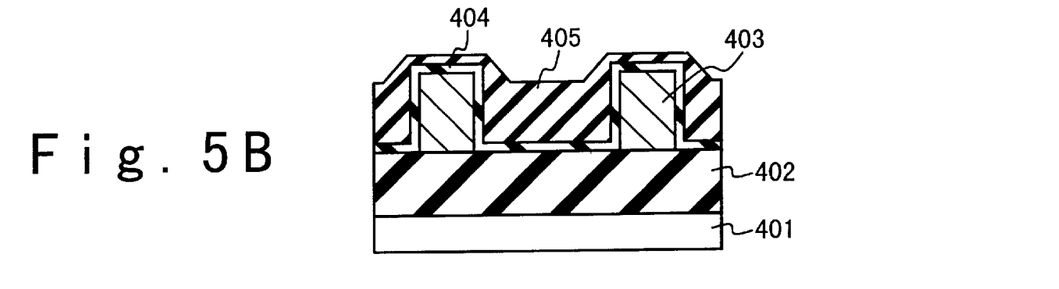

Next, as shown in FIG. 5B, HSQ is dissolved by the solvent MIBK (methyl isobutyl ketone) and the solution is spin coated on the liner insulating film 404. Then, the substrates formed thus are baked at the temperatures of about 150, 200 and 350° C. for one minute by a hot plate, respectively. Subsequently, the substrates are carried into a vertical diffusion furnace and are baked at a temperature of 400° C. for one hour in a nitrogen atmosphere. Thus, a HSQ-SOG film 405 is formed.

Figure 5C:
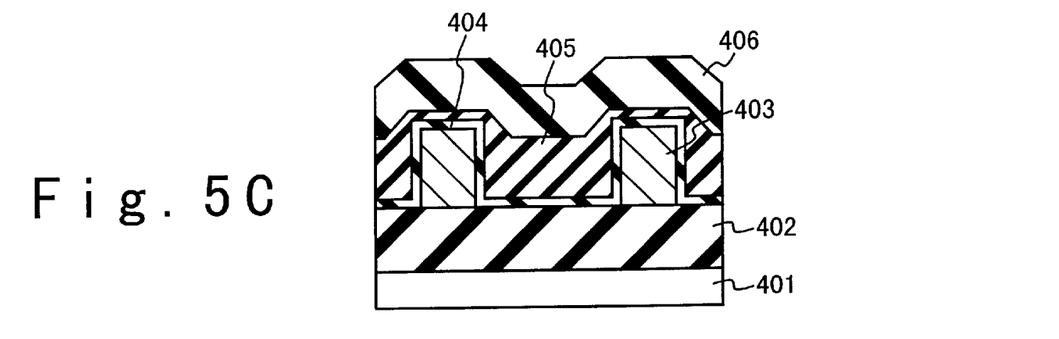
Figure 5D:
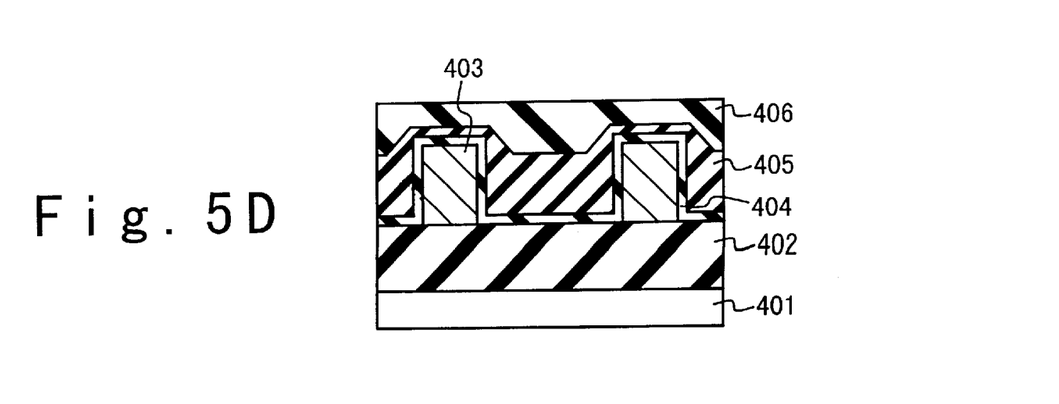

Next, as shown in FIG. 5C, a silicon oxide film 406 with a low moisture containing percentage is formed on the HSQ-SOG film 405 by a parallel plate type plasma CVD apparatus using $SiH_4$ gas, to have the film thickness of about 14000 Å, like the first embodiment.

In the second embodiment, the SiON film formed using $SiH_4$ gas is formed under the HSQ-SOG film and the silicon oxide film using $SiH_4$ gas is formed on the HSQ-SOG film. Both of the SiON film and the silicon oxide film are films with low moisture containing percentages. For this reason, moisture does not invade the HSQ film at the time of baking process. Therefore, the dielectric constant never increases. When the capacity between the wiring patterns in the second embodiment is measured, the capacitance decreases by 18% less than the capacitance of the above mentioned comparison sample.

Next, the semiconductor device according to the third embodiment of the present invention will be described below. The method of manufacturing the semiconductor device in the third embodiment is substantially the same as that in the second embodiment. The difference point of the third embodiment from the second embodiment is in that the liner insulating layer is a silicon oxide film which is formed by using organic silane having Si—H couplings, instead of the SiON film. That is, in this embodiment, the liner oxide film is formed by a dual frequency parallel plate type plasma CVD apparatus using TMS and a $N_2O$ gas. Thus, in the third embodiment, the low dielectric constant film structure can be also realized, as in the second embodiment.

As described above, according to the present invention, when the low dielectric constant film such as a HSQ-SOG film is formed, an insulating layer with a low moisture containing percentage is arranged as a lower layer of the HSQ-SOG film. Therefore, it is possible to prevent moisture from invading the HSQ film at the time of the baking process. Thus, according to the present invention, it is possible to restrain that the Si—H coupling of the low dielectric constant film is changed into the Si—OH coupling, so that the increase of the dielectric constant of the low dielectric constant film can be suppressed.

Also, if an insulating layer with a low moisture containing percentage is formed on the low dielectric constant film, the dielectric constant of the low dielectric constant film can be more stabilized.

Further, when the metal wiring pattern is covered by the liner insulating layer with a low moisture containing percentage, the fitness of the low dielectric constant film to the metal wiring pattern can be improved, in addition to the above-mentioned effects. Thus, peeling of the low dielectric constant film can be restrained.

The lower layer of the HSQ-SOG film is formed by a high density plasma CVD method using $SiH_4$ or an organic silane in which a part of the —H groups is substituted by an alkyl group. The silicon oxide film formed thus has a low moisture containing percentage. Therefore, even if the substrate is baked after the spin coating of HSQ, the escape of moisture from the lower layer does not occur and moisture never invades the HSQ-SOG film.

What is claimed is:

1. A semiconductor device comprising:
   a first interlayer insulating film formed on an upper surface portion of a semiconductor substrate;
   wiring patterns formed on an upper surface portion of said first interlayer insulating film;
   a second insulating film formed to cover exposed portions of said upper surface portion of said first insulating film and said wiring patterns; and
   a third insulating film formed covering said second insulating film, and
   wherein at least an upper surface portion of said first insulating film has a moisture containing percentage lower than that of said second insulating film.

2. A semiconductor device according to claim 1, further comprising a liner insulating film formed to cover exposed portions of said upper surface portion of said first insulating film and said wiring patterns, said second insulating film being formed on said liner insulating film.

3. A semiconductor device according to claim 1, wherein said second insulating film has a relative dielectric constant smaller than 3.5.

4. A semiconductor device according to claim 1, wherein said second insulating film includes Si—H couplings.

5. A semiconductor device according to claim 1, wherein said at least an upper surface portion of said first insulating film has a moisture containing percentage lower than 0.02 wt %.

6. A semiconductor device according to claim 5, wherein said second insulating film is formed of one of a silicon oxide film containing a PSG film and a BPSG film, a silicon oxide nitride (SiON) film, a silicon nitride film, and a fluorine containing silicon oxide film.

7. A semiconductor device according to claim 1, wherein at least a lower surface portion of said third insulating film has a moisture containing percentage lower than 0.02 wt %.

8. A semiconductor device according to claim 7, wherein said third insulating film is formed of one of a silicon oxide film containing a PSG film and a BPSG film, a silicon oxide nitride (SiON) film, a silicon nitride film, and a fluorine containing silicon oxide film.

9. A method of manufacturing a semiconductor device as claimed in claim 1, comprising the steps of:
   forming a first insulating film on an upper surface portion of a semiconductor substrate such that at least an upper surface portion of said first insulating film has a first moisture containing percentage;
   forming wiring patterns on said upper surface portion of said first insulating film;
   forming a second insulating film to cover exposed portions of said upper surface portion of said first insulating film and said wiring patterns, said second insulating film having a second moisture containing percentage lower than said first moisture containing percentage; and
   forming a third insulating film on said second insulating film.

10. A method according to claim 9, wherein said step of forming a second insulating film includes forming said second insulating film by a spin-coating method using HSQ (hydrogen silisesquoxane: $HSiO_{3/2}$) or polysilazane.

11. A method according to claim 10, wherein said step of forming a second insulating film includes performing a first heat treatment to said second insulating film formed by the spin-coating method at a predetermined temperature for a predetermined time, wherein said second moisture containing percentage is a moisture containing percentage after said first heat treatment.

12. A method according to claim 9, wherein said step of forming a first insulating film includes forming said first insulating film by a CVD method using a SiH4 gas or an organic silane source with Si—H couplings as a reacting source.

13. A method according to claim 12, wherein said first insulating film is formed of one of $SiO_2$, $SiO_2$ including P or B, $Si_3N_4$, SiON, and SiOF.

14. A method according to claim 12, further comprising the step of performing a second heat treatment to said first insulating film before said step of forming said second insulating film, wherein said first moisture containing percentage is a moisture containing percentage after said second heat treatment.

15. A method of manufacturing a semiconductor device as claimed in claim 2, comprising the steps of:

forming a first insulating film on an upper surface portion of a semiconductor substrate;

forming wiring patterns on said upper surface portion of said first insulating film;

forming a liner insulating film to cover exposed portions of said upper surface portion of said first insulating film and said wiring patterns such that at least an upper surface portion of said liner insulating film has a first moisture containing percentage;

forming a second insulating film on said liner insulating film, said second insulating film having a second moisture containing percentage lower than said first moisture containing percentage; and forming a third insulating film on said second insulating film.

16. A method according to claim 15, wherein said step of forming a liner insulating film includes forming said liner insulating film by a CVD method using a SiH4 gas or an organic silane source with Si—H couplings as a reacting source.

17. A method according to claim 16, wherein said liner insulating film is formed of one of $SiO_2$, $SiO_2$ including P or B, $Si_3N_4$, SiON, and SiOF.

18. A method according to claim 16, further comprising the step of performing a third heat treatment to said liner insulating film before said step of forming said second insulating film, wherein said first moisture containing percentage is a moisture containing percentage after said third heat treatment.

* * * * *